United States Patent [19]

Busch et al.

[11] 4,170,752

[45] Oct. 9, 1979

[54] SYSTEM FOR DETERMINING AND CALCULATING THE WORK DONE BY A MOBILE ELECTRICAL MACHINE AT AN ENERGY SUPPLY STATION

[75] Inventors: Heinrich Busch, Wesel; Eberhard Zander, Kirchhellen, both of Fed. Rep. of Germany

[73] Assignee: GES Gesellschaft fur Elektrischen Strassenverkehr mbH, Dusseldorf, Fed. Rep. of Germany

[21] Appl. No.: 833,995

[22] Filed: Sep. 16, 1977

[30] Foreign Application Priority Data

Sep. 17, 1976 [DE] Fed. Rep. of Germany ....... 2641806

[51] Int. Cl.² ............................................... H02J 7/00
[52] U.S. Cl. ..................................... 320/44; 194/1 N; 194/11; 320/21
[58] Field of Search .................... 320/2, 44, 43, 45, 48, 320/56, 21; 194/1 N, 11, 49; 180/65 R

[56] References Cited

U.S. PATENT DOCUMENTS

| 735,505 | 8/1903 | Haskins | 320/2 UX |
| 3,365,045 | 1/1968 | Guttmann et al. | 194/1 N |
| 3,371,194 | 2/1968 | Ostreicher | 320/44 X |
| 3,778,637 | 12/1973 | Arita | 194/11 X |
| 3,938,018 | 2/1976 | Dahl | 320/2 |

OTHER PUBLICATIONS

*Proc. I.E.E.,* vol. 119, No. 6, Jun. 1972, Moreton, "Fuel Guage for the Electric Car".

*Primary Examiner*—Robert J. Hickey
*Attorney, Agent, or Firm*—Karl F. Ross

[57] ABSTRACT

A system for determining and accounting for the service of an electric vehicle provided with a battery which has an electric-current supply network, a pulse generator connected between this network and the vehicle for generating a time-spaced sequence of accounting pulses representing at least the value of electrical energy delivered to the vehicle, a pulse counter connected to the pulse generator for counting pulses derived from the pulse generator over a time interval corresponding to that for which the vehicle is connected to the network, and an evaluator in the form of a deductor on said machine responsive to the count of the counter and connected thereto for registering the value at least of electrical energy supplied to said machine.

11 Claims, 4 Drawing Figures

ELECTRICALLY POWERED VEHICLE

SYSTEM FOR DETERMINING AND CALCULATING THE WORK DONE BY A MOBILE ELECTRICAL MACHINE AT AN ENERGY SUPPLY STATION

FIELD OF THE INVENTION

The present invention relates to a system (apparatus or device) for determining and calculating (accounting for) the work done by a mobile electrical machine at an electric-power supply station at which the electrical machine is resupplied with energy from a direct-current, alternating-current, or three-phase network. A mobile electrical machine, for the purposes of the present invention, is especially an electric vehicle, e.g. an electric automobile or truck, having electrochemical energy storage, e.g. a rechargeable battery.

BACKGROUND OF THE PRESENT INVENTION

While mobile electrical machines and especially electric vehicles having rechargeable energy-storage means such as batteries, are known, there have not been provided heretofore to our knowledge, any means for determining the effective work done by such vehicles or for accounting for the energy consumption thereof. Such vehicles are, of course, generally recharged from an electrical supply network and hence all accounting for the electric power supplied has hitherto been in the nature of measurement of the power supplied by the vehicle-owner's network to his own vehicles.

With automotive vehicle powered by other means, e.g. gasoline or diesel fuel, there exist service stations distributed throughout a region at which a vehicle can be refilled with the energy medium, namely, the fuel. At such stations, the fuel metered into the vehicle is determined and an immediate accounting is provided whereby the fuel consumed is charged to the user.

With increasing usage of electric motor vehicles, there is a need for an infrastructure of supply stations at which the vehicles can be recharged, i.e. supplied with electrical energy which is stored by, for example, the electrochemical means described previously. Until now, to our knowledge, there has been no practical way in which this could be achieved at a plurality of electrical-supply service stations so that a fair accounting for the electrical consumption of and other charges for operating the vehicle could be made.

OBJECT OF THE INVENTION

It is, therefore, the object of the present invention to provide a relatively simple and economically sound system for determining the effective work done by a mobile electrical machine and for accounting for the electrical energy consumed thereby.

SUMMARY OF THE INVENTION

This object and others which will become apparent hereinafter are attained, in accordance with the present invention, with a system which comprises a pulse generator for generating a time-space sequence of calculating pulses corresponding to the electrical work derived from the supply station, and, if desired, service and other work. The pulse generator is connected by a transfer path to a pulse counter which, in turn, is connected to a deductor or depreciator. The electrical work delivered by the supply station means mainly the electrical energy supplied to the movable electrical machine and generally corresponds to the electrical energy necessary to recharge the energy storage unit thereof and hence the electrical energy consumed in prior operation of the machine. Service and other work charges include fees for maintenance work upon the mobile electrical machine, fees for the use of the supply station, rental charges for the energy-storage unit, fees for refilling or adding electrolyte to the energy storage unit and the like.

The advantage of the system of the present invention resides primarily in that it provides an arrangement for determining and accounting for the energy and services supplied to a mobile electrical machine by a delivery or service station which is practically maintenance-free and highly dependable because it has practically no mechanically moving parts and can be constructed with conventional integrated or other electronic circuit components which are commercially available. Moreover, it permits the supply station to be more or less automatic in that it can be completely self-service so that only the user of the electrical machine need be available. All that is necessary is that appropriate payments be made to set the deductor or depreciating unit at the desired level for a period of future use.

The system of the present invention can be embodied in numerous configurations. For example, the pulse generator can, in the simplest case, be provided as a switching block in the line for supplying electrical energy to the vehicle so that the same transmission line can be used for delivery the electrical energy for recharging the battery and the calculating or accounting pulses for the pulse counter.

In a preferred embodiment of the invention, the pulse generator is set to deliver a time-space sequence of accounting pulses corresponding to the electrical energy supplied in dependence upon the basic charge and/or a graded or staggered charge corresponding to the usual tariffs for electrical energy supply. A staggered or graded tariff permits the use of the supply station to be regulated so that the highest charge applies to the highest electrical demand period. Thus, during the high-demand times, the calculating pulse cadence, i.e. the number of pulses per unit time, can be higher than at low-demand periods. Thus the charges for supplied energy and other services can be greater during the day than at night.

The pulses corresponding to the service energy and other charges can be supplied as a separate calculating pulse or sequence of pulses or by controlling the frequency of the counting pulses for the electrical energy.

When the electrical supply station is energized by alternating or three phase current and the electrochemical energy storage unit is, for example, a lead-acid battery, there is interposed between the supply network and the battery, a charging unit, e.g. a rectifier network. This charging unit or rectifier network is, according to the invention, adjustable as to charging voltage, charging current or power, etc. Since the charging unit must generally supply different charging currents at different efficiencies to various energy-storage units in a variety of vehicles, the pulse generator, according to the invention, is controlled in dependence upon the charging energy delivered and/or the charging voltage with a constant charging current or in response to the charging current with a constant charging voltage so that the pulse sequence always corresponds to the energy supplied.

The pulse counter and the depreciator which constitute a credit balance unit, from which the pulses deduct corresponding to the energy supplied and other work performed or charges applied at the supply station in the manner described above, while preferably arranged on the mobile electrical machine. Thus, the deductor or depreciator can be provided with a given credit balance in accordance with payments made by the user of the vehicle, from which the charges indicated by the pulses are deducted. The credit balance unit can visually display, by suitable indicia, the balance remaining.

The depreciator or deductor is advantageously provided with switching means to cut off the energy supplied or interrupt the connection with the service station when the credit balance is eliminated and/or the battery is fully charged. This interruption can also be effected when the rental period for the energy storage unit has been exceeded and/or when a predetermined number of charge/discharge cycles for the energy storage unit has been reached. This ensures maintenance of the energy storage unit, when the latter is rented from the service station, at proper intervals.

It is known that the energy efficiency and the useful life for an energy storage unit such as a lead-acid battery are dependent upon certain energy storage parameters such as charge retention, voltage, current, temperature or the like. In addition, the energy storage unit may require maintenance at intervals which are dependent upon the recharge capabilities of the battery, the number of deep discharges, the stand time in a discharged state or the like.

Accordingly, the invention provides that the pulse generator is connected with measuring and/or transducer or converter means for determining one or more of the aforementioned energy-storage operating parameters which can be connected to the energy storage unit at a controlled time when the pulse generator is connected to the vehicle or the supply or service station.

In this manner, the energy-storage operating parameter can be monitored, at least during the battery-charging process, at a surface station to generate additional calculating or accounting pulses or to effect the usual sequence of calculating pulses to provide for any additional charges which may be required. The monitoring system can also be provided with an indicator or an alarm circuit to alert the operator that maintenance is required and/or to an indicator for the state of the charge of the energy storage unit so as to indicate, if necessary, a requirement for replacement of the energy storage unit or the recharging thereof. It also may be connected to an indicator to alert the operator to any other defect or operating state for which such an alert may be desirable. An indicator, for example, can be provided as a counter while the monitoring device can generate corresponding electrical pulses which can be counted therein so that similar components can be used as are used for the aforementioned pulse generator and pulse counter.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
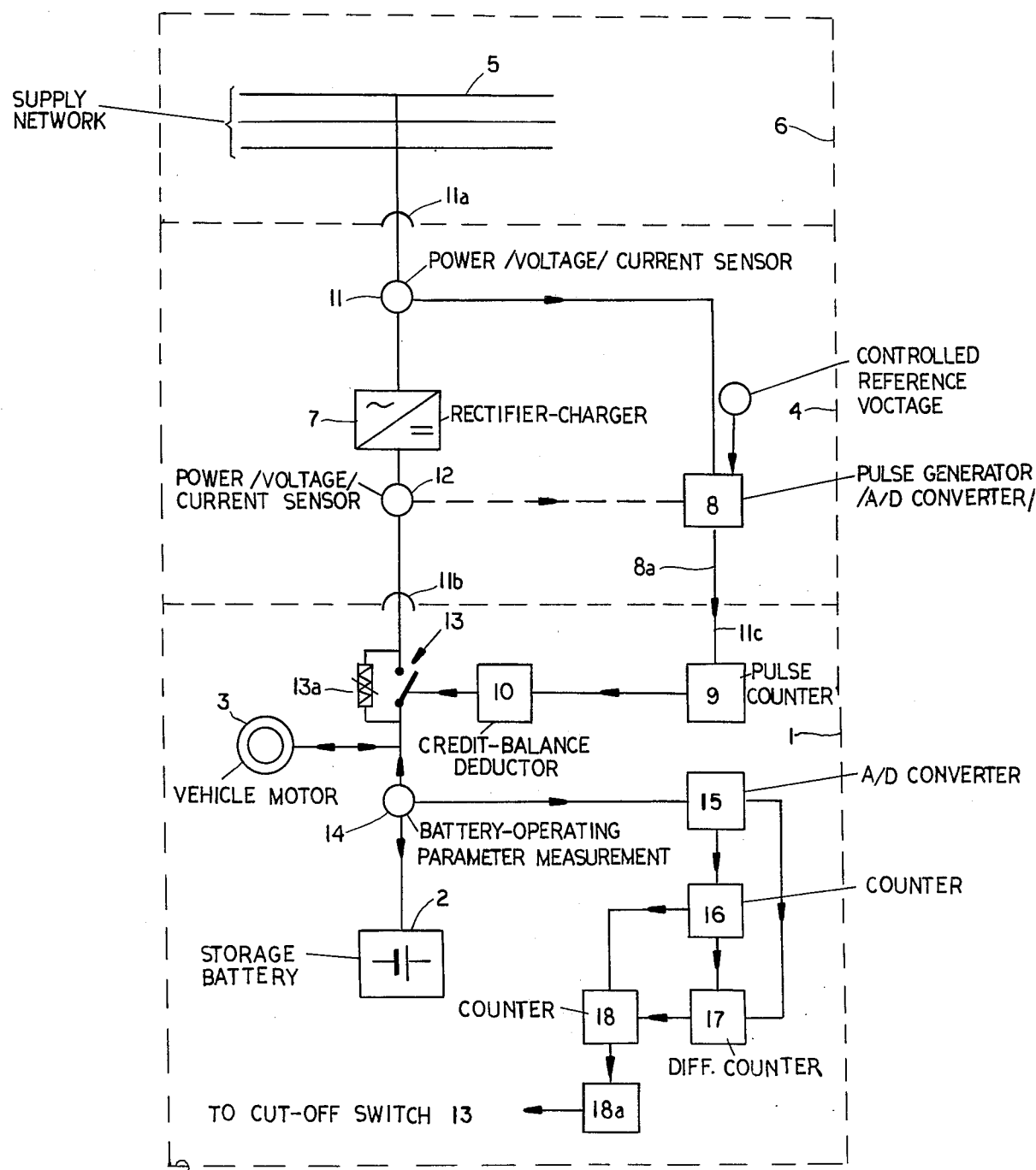
FIG. 1 is a block diagram of a system according to the invention in which the pulse generator can be connected as part of a charging unit between the supply network and the vehicle.

In the drawing and in the specific description below, identical reference numerals are used to designate identical components of the systems according to the invention or components which function identically.

FIG. 1 illustrates schematically a system for determining and accounting for the electrical energy supplied to a movable electrical machine in the form of an electric-powered vehicle 1 having an electrochemical energy storage unit 2, e.g. a lead-acid storage battery. The vehicle is provided with an electric motor 3 which propels the vehicle and the energy consumed by the vehicle is evaluated whenever the latter is connected to a service station represented at 4.

At the service station 4, the energy storage unit 2 can be electrically charged from an electric supply network 5 of alternating-current or three phase lines. The energy supply station is represented generally at 6.

Plug-and-socket electrical connectors, represented schematically at 11a, 11b and 11c are provided to connect unit 6 with unit 4 and unit 4 with the vehicle 1 when the latter is brought into the station for service.

The alternating-current or three-phase network 5 of the power system 6 and the electrochemical energy storage unit 2 of the vehicle 1 are interconnected at the service station 4 by a rectifying charging unit represented diagrammatically at 7, i.e. any conventional battery charger.

In addition, the system includes a pulse generator 8 which generates a time-space sequence of electrical accounting pulses of predetermined energy content corresponding to the electrical energy supplied by the service station and any service or other charges which are to be charged off against the user. The pulse generator 8 is connected by a line 8a to the vehicle and the vehicle can be provided with a pulse counter 9 to which the line 8a is connected by plug-and-socket arrangement 11c.

The pulse counter 9 is connected, in turn, to a credit balance deductor 10. In this embodiment, the pulse generator 8 is provided at the service station 4 while the pulse counter 9 and the credit balance deductor 10 are provided upon the vehicle 1.

The pulse generator 8 provides a time-space sequence of calculating pulses which can correspond to the supplied electrical energy in accordance with a basic tariff and/or a staggered or graded tariff as described above corresponding to the demand upon the energy supply system 6 and, upon the power consumption and/or charging voltage and/or the charging current of the charging unit 7. Corresponding measuring circuits 11 and 12 are provided in the service station 4 to control the pulse generator 8 correspondingly.

In the pulse generator, the measured power or other parameter, for example the charging current of the charging unit 7 is transformed into an output signal such that the measured parameter appears as a proportional voltage which is integrated with time and is compared to a reference voltage. Upon voltage equality, an accounting pulse is delivered via line 8a to the pulse counter 9. The pulse generator 8 thus functions in the manner of an analog-digital converter.

By controlling the reference voltage in accordance with the corresponding valuing parameters such as service time of the day, the tariff of the supply company, the charging voltage or the like, the pulse frequency and thus the dollar value of the train of calculating pulses can be varied.

The x deductor or depreciator 10 is provided as a credit balance deductor. The credit balance deductor 10 is connected with a switch 13 in circuit with the charger 7 to interrupt charging when the credit value upon the deductor 10 has been consumed.

In addition, the energy-storage unit 2 of the vehicle is provided with a further measuring and converter arrangement 14, 15 for determining one or more energy-storage operating parameters, such as current, voltage and temperature of the energy storage unit 2 in dependence upon time. With the aid of a commutating switch, not shown, the current and voltage at the battery 2 during the charging thereof and the current and voltage during discharge of the battery, i.e. during normal operation of the vehicle, may by measured by this circuit. Monitoring of the voltage permits deep discharges and stand times in a discharge state to be determined. The measuring and x converter circuit 14, 15 is provided with indicators 16, 17 and 18 which can register the stored energy, the state of charge of the battery and a need for maintenance of the battery, respectively.

The indicators 16, 17 and 18 are preferably counters while circuit 15 is a pulse generator controlled by the monitoring or measuring unit 14.

The energy delivered during charging can be registered in the first counter 16 while counter 18 can indicate any need for maintenance. The state of the charge at any time can be registered on counter 17, either counter 16 or counter 17 operating the maintenance-required indicator 18.

The counter 17 can be a differential counter which counts down as energy is consumed. In a zero state of the differential counter 17, the energy storage unit 2 is fully discharged and an appropriate indication is provided by the maintenance-required counter 18. The latter can also indicate, after a plurality of charge-discharge cycles, e.g. via a further counter 18a, the requirement for more extensive maintenance than recharging. In this case, unit 18a can be connected to a switch for preventing recharging unit 1 until the necessary maintenance has been performed.

A resistor 13a bridged across a switch 13 permits operation of the circuit 14–18 but prevents any significant recharging of the battery when the switch 13 is open.

Figure 2:
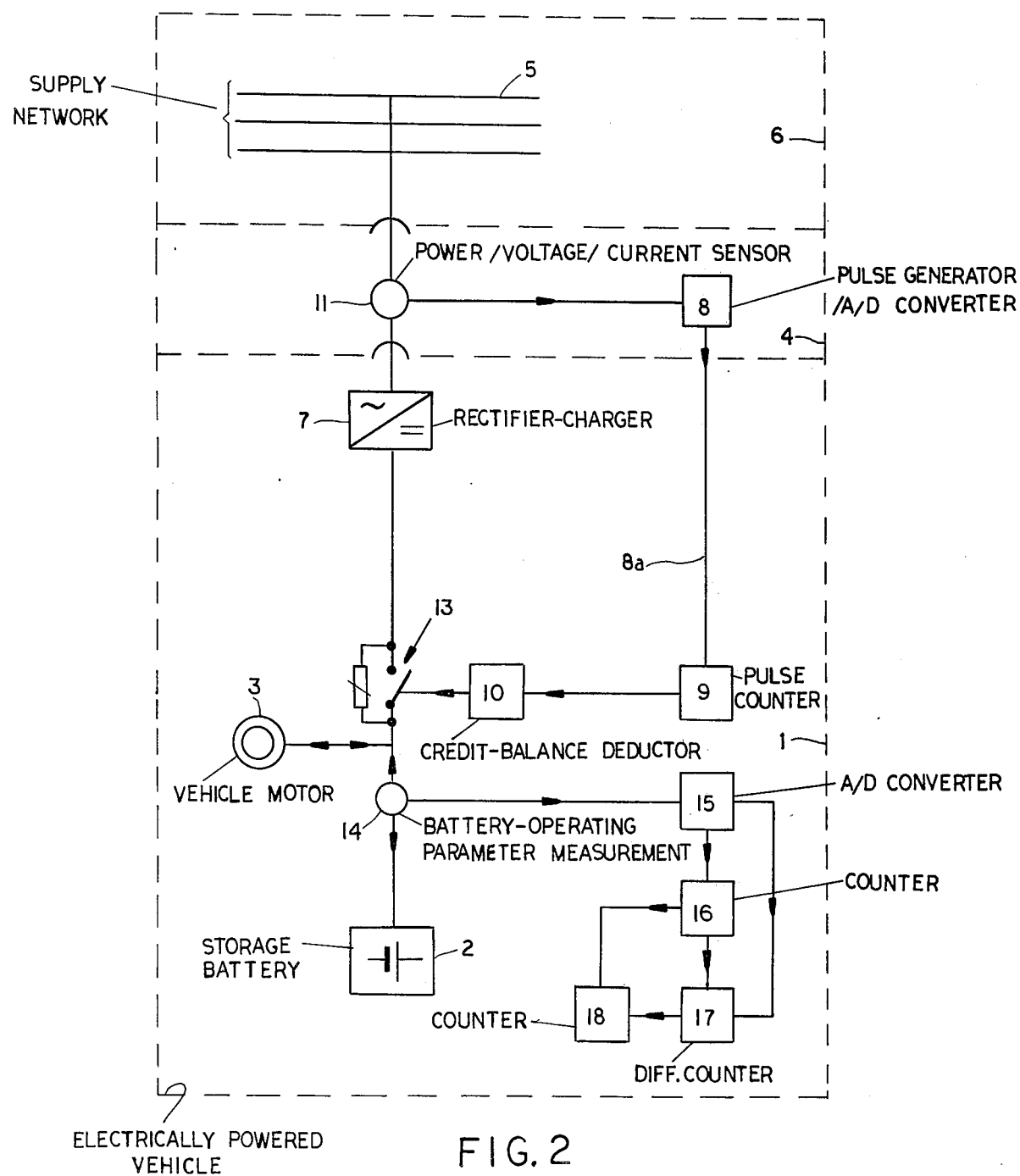
FIG. 2 is a block diagram of a system in which the charging unit, i.e. the rectifier system is carried by the vehicle but the pulse generator is connected between the supply network and the vehicle.

In the embodiment of FIG. 2, the charging unit or rectifier 7 is provided upon the vehicle 1 so that only the pulse generator 8 and the monitoring or measuring circuit 11 are provided at the service station of the components described previously. In this case, the monitoring or measuring circuit 12 can be eliminated.

Figure 3:
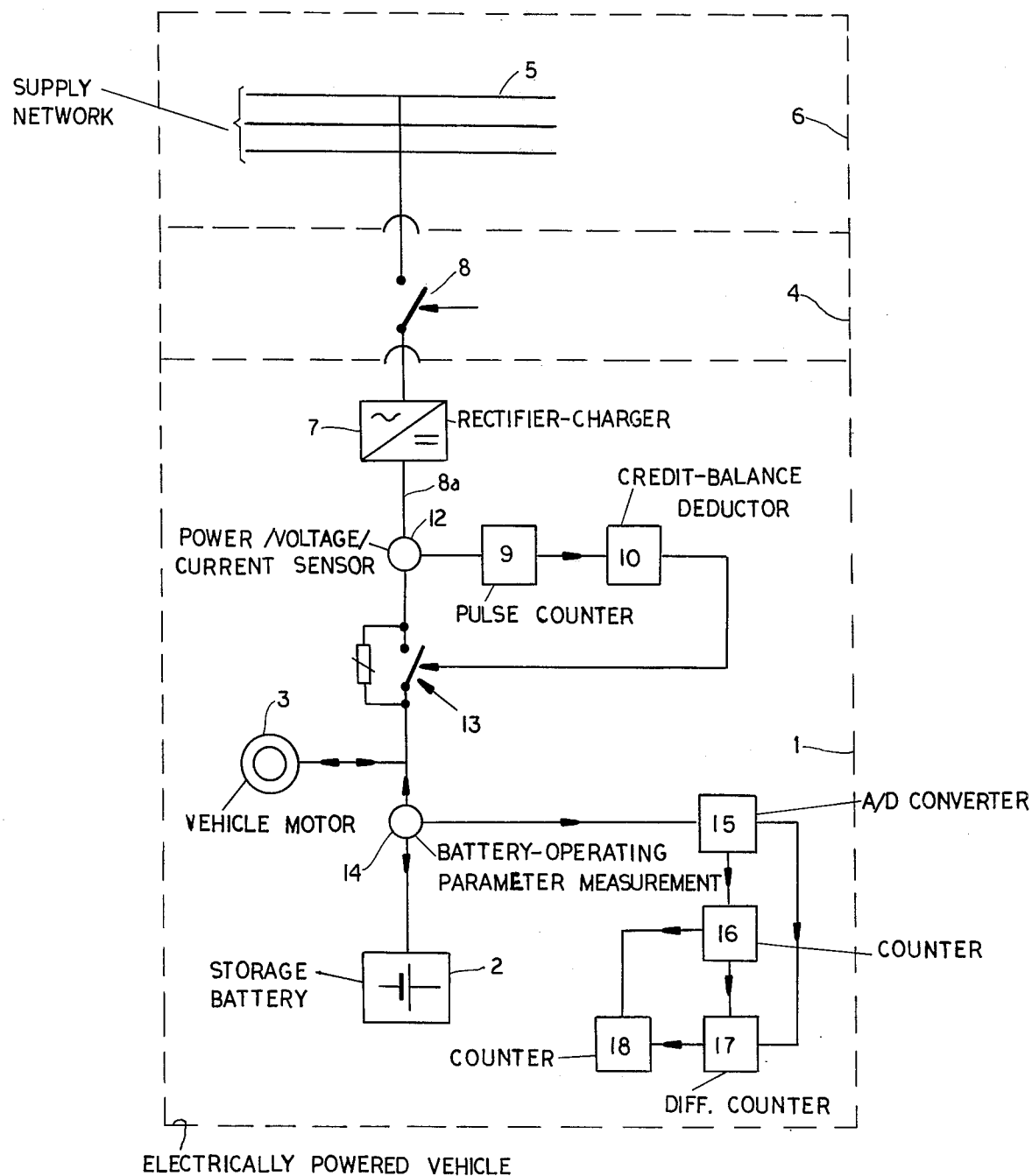
FIG. 3 is a block diagram illustrating another embodiment of the invention in which the pulse generator is provided upon the vehicle.

The embodiment of FIG. 3 is used when a separate pulse generator is not desired, i.e. when only a single line is used to connect the vehicle with the service station. In this case, the charging pulses also serve as the accounting pulses.

In this case, the service station 4 is provided with a switch 8 which is periodically triggered by an appropriate circuit in accordance with the tariff requirements as described. The switch thus acts as a pulse generator which periodically connects and disconnects the charger 7 to the supply line 5.

The control circuit for the switch 8, not shown, ensures that each current pulse has the same current-supply content. Thus, upon reduction of the current amplitude with increasing counter voltage in the battery 2, the duration of the current pulse is increased.

The measuring circuit 12 and the pulse counter 9 need only respond to the number of equal-current pulses so that the credit-balance deductor 10 is correspondingly diminished only in accordance with the current actually delivered. The switch 13 is then opened in the manner previously described, the resister bridging the switch 13 permitting the passage of a charging current only sufficient to balance the self-discharge of the battery 2. Otherwise the system operates in the manner described in connection with FIG. 1.

Figure 4:
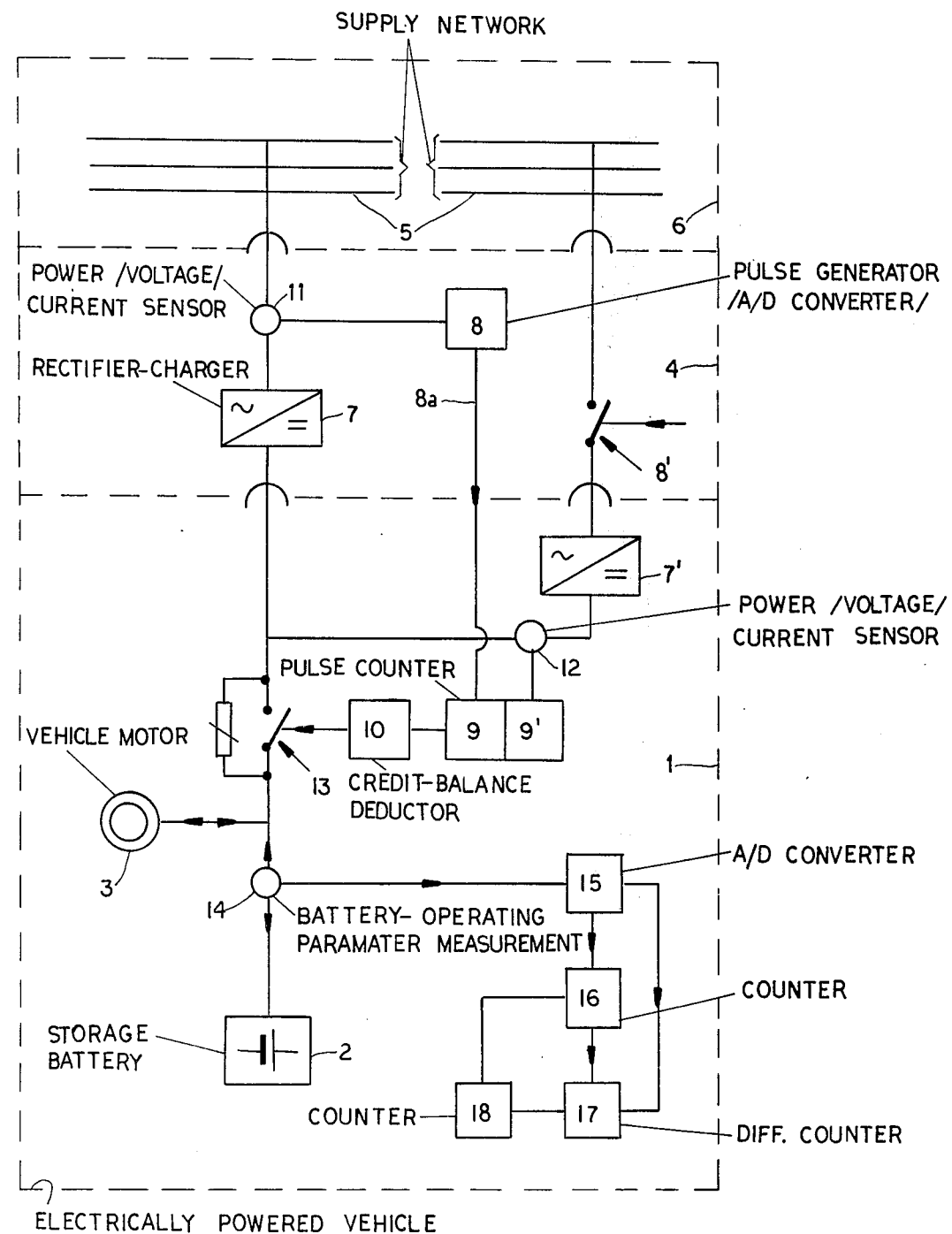
FIG. 4 is a block diagram of still another embodiment of the present invention.

The embodiment shown in FIG. 4 is a combination of the embodiments described in connection with FIGS. 1 and 3 and can be used when the station 4 has either of the configurations represented in FIGS. 1 and 3. Thus, corresponding to FIG. 1, the supply of a high charging current using the high-power or high-capacity charger 7 of the service station 4 is possible while, on the other hand, corresponding to FIG. 3, the battery can be charged through a smaller and lighter rectifier unit 7' via the periodically operated switching circuit 8' of the service station 4 so that a lower current amplitude over a longer period can be delivered.

The functioning and construction of the circuit elements corresponds to those described in FIGS. 1 and 3. In this case, however, the doubly controlled counter 9,9' is used to operate the credit-balance accounting block 10. In this case, the measuring circuit 12 is connected between the rectifier 7' and the battery 2 while the measuring circuit 11 is connected ahead of the rectifier 7 and between the latter and the supply line 5.

When the battery of the vehicle is to be charged only by the rectifier 7', the switch 8' may be permanently closed, whereupon the control circuit previously described for this switch to periodically trigger the same can be applied to switch 13. The sensor 12, of course, responds to these current pulses in the manner previously described.

We claim:

1. A system for determining and accounting for the service of a mobile electrical machine provided with an electrical energy storage unit including a battery, said system comprising:
   an electric-current supply network;
   a pulse generator connected between said network and said machine for generating a time-spaced sequence of accounting pulses representing at least the value of electrical energy delivered to said machine, said pulse generator being constructed and arranged to delliver a train of pulses of a cadence corresponding to a variable electric tariff;
   a pulse counter connected to said pulse generator for counting pulses derived from said pulse generator over a time interval corresponding to that for which said machine is connected to said network;
   evaluating means on said machine responsive to the count of said counter and connected thereto for registering the value at least of electrical energy supplied to said machine; and a current supply path connecting said network to said energy-storage unit and including a battery charger, said evaluating means including a deductor, said deductor being a credit-balance deductor settable to a predetermined value from which a value corresponding to the count in said counter is deducted during the charging of said battery.

2. The system defined in claim 1 wherein said pulse generator is a circuit element connected in said path.

3. The system defined in claim 1 wherein said charger has a variable current and voltage output, said pulse generator being connected to means for measuring a charging parameter for varying the pulse cadence in accordance with said parameter.

4. The system defined in claim 1 wherein said pulse counter is provided on said electric machine.

5. The system defined in claim 1, further comprising switch means along said path controlled by said deductor.

6. The system defined in claim 1, further comprising means connected to said battery for detecting at least one energy-storage operating parameters in dependence upon time, and indicator means connected to said detecting means for providing at least one indication responsive to the detected parameter.

7. The system defined in claim 6 wherein said indicator means is constructed and arranged to provide a measure of the charge delivered to said battery.

8. The system defined in claim 6 wherein said indicator means is constructed and arranged to provide a measure of the state of charge of said battery.

9. The system defined in claim 6 wherein said indicator means is constructed and arranged to signal the need for maintenance of said battery.

10. The system defined in claim 6 wherein said indicator means is a counter.

11. The system defined in claim 1 wherein said pulse generator is constructed and arranged to regulate said pulse train in accordance with battery-service charges.

* * * * *